United States Patent [19]

Humphrey

[11] 4,325,454

[45] Apr. 20, 1982

[54] SPEAKER SYSTEM WHICH INVERTS AND REDIRECTS THE SPEAKER BACKWAVE

[76] Inventor: Theodore J. Humphrey, 3216-21st Ave. W., Seattle, Wash. 98199

[21] Appl. No.: 192,001

[22] Filed: Sep. 29, 1980

[51] Int. Cl.³ .................................... H05K 5/00

[52] U.S. Cl. .................................... 181/145; 181/155

[58] Field of Search ............... 181/144, 145, 155, 156, 181/163, 199; 179/1 E, 115.5 PS, 1 GA

[56] References Cited

U.S. PATENT DOCUMENTS

| | | | |
|---|---|---|---|
| 2,792,069 | 5/1957 | Gately, Jr. | 181/145 |
| 4,064,966 | 12/1977 | Burton | 181/144 |
| 4,146,111 | 3/1979 | Mae et al. | 181/163 |

*Primary Examiner*—L. T. Hix
*Assistant Examiner*—Benjamin R. Fuller
*Attorney, Agent, or Firm*—Cole, Jensen & Puntigam

[57] ABSTRACT

A speaker housing includes an air-impermeable first chamber in which first and second speakers, each having diaphragms which vibrate in operation, are so mounted that the rear surfaces of the diaphragms of both speakers face the inside of the first chamber and the front surfaces of the diaphragms of both speakers face outside the first chamber. The axes of the two speakers are perpendicular. The front surface of the diaphragm of the second speaker faces the inside of a second chamber in the housing which includes a slant board oriented at an angle to the axis of the second speaker. The two speakers are driven such that the sonic pressure wave off the rear surface of the diaphragm of the first speaker is effectively coupled from the air-impermeable first chamber through the second speaker, maintaining the pressure within the air-impermeable first chamber substantially constant. The sonic pressure wave off the front surface of the diaphragm of the second speaker strikes the slant board, reverses phase and is directed out of the housing with substantially the same phase as the sonic pressure wave off the front surface of the diaphragm of the first speaker.

4 Claims, 2 Drawing Figures

SPEAKER SYSTEM WHICH INVERTS AND REDIRECTS THE SPEAKER BACKWAVE

BACKGROUND OF THE INVENTION

This invention relates generally to the art of speaker systems designed for sound reproduction, and more specifically concerns those speaker systems which include one or more speakers characterized by the presence of front and back waves produced by a vibrating diaphragm.

A major problem of conventional speaker systems which use a vibrating diaphragm to produce sound is the adverse affect on the sound resulting from the back wave which is produced off the rear surface of the diaphragm of the speaker or speakers in the system. The vibrating diaphragm produces a front wave off its front surface, and a back wave off its back surface. If the back wave is not dealt with in some manner, it will reflect off solid objects, moving back in front of the speaker, where it mixes with the front wave, typically substantially reducing the front wave. This has a substantial negative impact on the efficiency and the fidelity of the system. In some cases, particularly at low frequencies, the speaker system will produce very little sound, because the back wave has virtually cancelled the front wave.

One solution to the back wave problem is to incorporate a speaker as part of a sealed chamber, so that the back wave produced by the speaker is captured within the chamber. However, in the operation of such a system, a varying pressure is produced within the chamber which tends to resist a change in the movement of the speaker diaphragm, thus significantly decreasing the efficiency of the speaker system or increasing system resonance. Other solutions, such as baffles, vented systems, and special horns also suffer from this disadvantageous decrease in system efficiency or lack of bass response.

Accordingly, it is an object of the present invention to provide a speaker system which deals with the back wave from diaphragm speakers in such a manner as to overcome one or more of the disadvantages of the prior art discussed above.

It is another object of the present invention to provide such a speaker system which includes an air-impermeable chamber in which the pressure and special volume of the chamber is maintained substantially constant.

It is a further object of the present invention to provide such a speaker system in which the back wave is used to improve the sound characteristics of the speaker system.

It is an additional object of the present invention to provide such a speaker system which has a substantially higher efficiency than present speaker systems.

It is yet another object of the present invention to provide such a speaker system having an improved bass response.

It is a still further object of the present invention to provide such a speaker system which can effectively use full range loudspeakers.

SUMMARY OF THE INVENTION

Accordingly, the present invention includes a speaker housing which itself includes an air-impermeable first chamber and a speaker mounted about an opening therein. The speaker includes a vibrating diaphragm which has front and rear surfaces, the speaker being positioned such that the rear surface of the speaker diaphragm faces the interior of the chamber and the front surface of the diaphragm faces outside the chamber, i.e. the atmosphere surrounding the chamber. In operation, a first pressure wave produced off the front surface of the diaphragm propagates away from the chamber into the atmosphere, while a second pressure wave produced off the rear surface of the diaphragm propagates within the first chamber, tending to produce a varying pressure in the first chamber. Means are provided which relieve the varying pressure with the chamber, so that the pressure within the chamber tends to remain substantially constant, by propagating from the chamber a third pressure wave which is a substantial replica of the second pressure wave. Means are also provided for reversing the phase of the third pressure wave and for directing it away from the housing, so that the first and third waves are substantially in phase.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
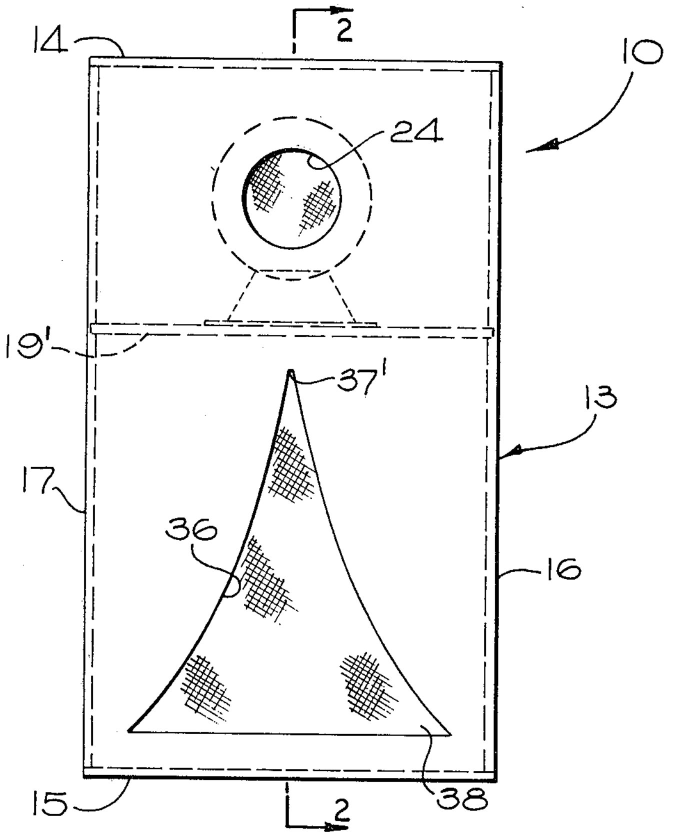
FIG. 1 is a front view of a speaker system constructed in accordance with the principles of the present invention.
Figure 2:
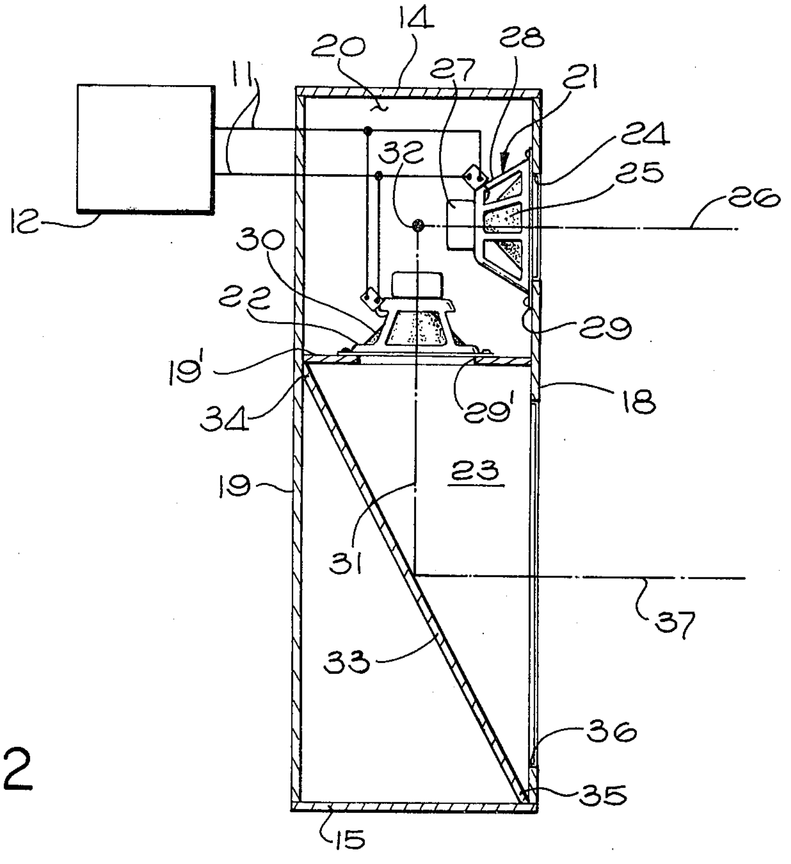
FIG. 2 is a central cross-section of the speaker system invention of FIG. 1 taken along lines 2—2 thereof.

Referring to FIGS. 1 and 2, a speaker system for reproducing sound in accordance with an audio frequency electrical signal is shown generally at 10. The audio frequency signal is provided by a signal source 12, which is connected to the speaker system 10 by a pair of input lines 11. Signal source 12 may be any conventional apparatus capable of producing an audio frequency signal, such as a high fidelity or stereophonic phonograph amplifier, a radio or television set, or a public address system.

The speaker system 10 includes a housing 13 which in the embodiment shown is rectangular in configuration, having parallel horizontal top and bottom walls 14 and 15, parallel vertical opposed side walls 16 and 17, and parallel vertical front and rear walls 18 and 19 which are perpendicular to side walls 16 and 17. A horizontal interior wall 19' divides the interior of housing 13 into an upper chamber 20 and a lower chamber 23.

A first speaker 21 is mounted about a circular opening 24 formed in the front wall 18 of the housing 13, with the circular opening 24 centered with respect to that portion of the front wall 18 which forms the front side of upper chamber 20. The speaker 21 has a frame 28 which includes a peripheral ring 29. In the embodiment shown, the peripheral ring 29 lays flat against the inner surface of the front wall 18 and the speaker is secured to the wall 18 by means of screws or the like through openings in lip 29, so that the speaker is in effect sealed to the back surface of front wall 18 about opening 24. Alternatively, the front portion of the speaker could extend through the opening, and the lip 29 sealed to the front surface of front wall 18.

Speaker 21 includes a cone-shaped diaphragm 25 having an axis of vibration 26 which extends horizontally outwardly from, and perpendicular to, front wall 18, so that the sound waves produced off the front surface of diaphragm 25 are aimed outwardly away from housing 13 in a pattern about axis 26. Diaphragm 25 is vibrated by a voice coil 27, which is secured to speaker frame 28 and which may be any one of several types of conventional speaker drivers, such as a permanent magnet or a dynamic motor. Diaphragm 25 in speaker 21 vibrates within frame 28 when actuated by voice coil 27.

That portion of the walls of housing 13 which form chamber 20 are constructed and arranged and comprise such a material that chamber 20 is air-impermeable. Thus, there is no air communication between the interior and the exterior of chamber 20. Speaker 21, as described above, is sealed annularly to front wall 18 about circular opening 24. Although diaphragm 25 is, of course, free to move within frame 28 of the speaker 21, it is air-impermeable.

In operation, the vibration of diaphragm 25 will result in the production of a pressure wave off the rear surface of diaphragm 25, which is normally referred to as a back wave. If not dealt with, this back wave would cause a varying pressure within chamber 20, which would lead to a significant decrease in speaker system efficiency or an increase in system resonance. The present invention, however, shown in one embodiment in FIGS. 1 and 2, deals with the back wave in such a manner as to substantially eliminate the negative impact on the efficiency or system resonance. In the embodiment shown, the varying pressure within chamber 20 is substantially completely relieved by the use of a second speaker 22 in chamber 20, mounted about a circular opening 29' in horizontal wall 19'. Opening 29' is similar to opening 24 in front wall 18, and speaker 22 is substantially identical to speaker 21. Speaker 22 is mounted to the upper, or lower, surface of horizontal wall 19' such that the rear surface of the diaphragm 30 of speaker 22 faces the inside of chamber 20, while the front surface of the diaphragm 30 faces downwardly, outside chamber 30. Thus, in the embodiment shown, speaker 22 is positioned at an angle of 90° relative to speaker 21, so that the two speakers 21 and 22 are mutually perpendicular.

The diaphragm 30 of speaker 22 has an axis of vibration 31 which is perpendicular to the axis of vibration 26 of speaker 21. The result of this arrangement is that a change in pressure within chamber 20 created by the vibration of diaphragm 25 of speaker 21 is relieved by a compensating, substantially opposite, movement of diaphragm 30 of speaker 22. For instance, when diaphragm 25 of speaker 21 is moving rearwardly, diaphragm 30 of speaker 22 is moving forwardly (downwardly in the embodiment shown), producing a pressure wave off its front surface which is substantially identical to the back wave produced off the rear surface of diaphragm 25 of speaker 21. Hence, the back wave off speaker 21 is effectively coupled out of chamber 20 by speaker 22, such that the pressure within chamber 20 remains substantially constant. Thus, that portion of the energy provided to the system which would otherwise be used by speaker 21 to overcome the varying pressure within chamber 20 created by its own backwave is no longer needed for that purpose, resulting in a significant increase in system efficiency or bass response.

The diaphragm 30 of speaker 22 may be driven in the compensating manner described above either actively, by an electrical signal which is 180° out-of-phase with the signal driving the first speaker 21, or passively, by the acoustic action of the backwave off speaker 21 itself, which establishes and maintains the necessary compensating vibration of the diaphragm of speaker 22, so that the diaphragms of the two speakers move in a push-pull arrangement.

As an example, FIG. 2 shows speakers 21 and 22 being actively driven by the same electrical signal, but the signal driving speaker 22 is 180° out-of-phase with the signal driving speaker 21. When the signal to speaker 21 energizes diaphragm 25 to move forwardly with respect to the speaker frame, i.e. to the right in FIG. 2, the signal to speaker 22 energizes diaphragm 30 to move rearwardly with respect to its speaker frame, i.e. upwardly in FIG. 2. Similarly, when the direction of diaphragm 25 reverses, so that it moves rearwardly, diaphragm 30 of speaker 22 will move downwardly.

When diaphragm 25 moves forwardly, the pressure in chamber 20 would otherwise tend to decrease, since the effective volume of chamber 20 would increase. However, the compensating upward movement of diaphragm 30 effectively equalizes the changes in volume caused by the movement of diaphragm 25, so that the pressure within chamber 20 remains substantially constant. In operation, the diaphragms of the two speakers move continuously in a push-pull relationship. In effect, the back wave from diaphragm 25, which decreases the efficiency of prior art speaker systems with air-impermeable chambers so dramatically, is not cancelled by the action of speaker 22, but rather is in effect coupled out of chamber 20, with the front wave off the front surface of diaphragm 30 of speaker 22 being substantially a replica of the simultaneously-produced back wave produced off the back surface of diaphragm 25 of speaker 21. The front wave off speaker 22, of course, is 180° out-of-phase with the front wave produced off the front surface of diaphragm 25. This front wave, in the embodiment of FIG. 2, is directed downwardly in a pattern about an axis which is perpendicular to the axis of propagation of the front wave off speaker 21.

Although the embodiment of FIG. 2 shows an active driving of diaphragm 30 of speaker 22, it should be remembered that the same effect could be achieved through a passive driving of the diaphragm, typically by acoustically coupling the diaphragms of the two speakers together. Further, the function of speaker 22 is to relieve the varying pressure within chamber 20 caused by vibrating diaphragm 25, and to effectively couple the back wave creating the varying pressure out of chamber 20. Using a speaker with a vibrating diaphragm is one preferred way of conveniently accomplishing the above two functions, but other structure could be used within the spirit of the present invention.

In operation of the system of FIGS. 1 and 2, a pressure wave which is a substantial replica of the back wave from speaker 21 is coupled out of chamber 20 into lower chamber 23. Within lower chamber 23 of housing 13, there is provided a slant board 33, which in the embodiment shown is positioned at an angle beneath speaker 22. In the embodiment shown, the longitudinal edges of slant board 33 are sealed to side walls 16 and 17; the upper edge 34 is connected to the junction of rear wall 19 and horizontal intermediate wall 19'; and the lower edge 35 is connected to the junction of front wall 18 and bottom wall 15 of housing 13.

Preferably, slant board 33 is oriented at such an angle that most if not all of the reflected pressure wave moves through the opening 36 in the front wall 18 of housing 13. In the embodiment shown, the position of speaker 22 is arranged relative to the angle of slant board 33 such that when the pressure wave produced off the front speaker 22 is reflected from the slant board, the axis of the reflected wave is horizontal, parallel to the axis 26 of the wave produced off the front of speaker 21. The exiting reflected wave is in phase with the wave from the front of speaker 21, thus eliminating the possibility of inter-wave cancellation.

The opening 36 formed in the front wall 18 of lower chamber 23 is shown most clearly in FIG. 1. Opening 36, through which the reflected pressure wave is directed, is somewhat triangular in configuration with a wide base 38, which is substantially as wide as the width of front wall 18, positioned relatively near the bottom of front wall 18 and two side edges which taper toward each other in a very slight curve or inward flare, meeting at a top point 37′ which is relatively near horizontal wall 19′ and approximately intermediate between the two side walls 16 and 17. The disclosed configuration of opening 36 assists in maintaining the fidelity of the resulting pressure waves, since it prevents development of unwanted resonant characteristics within lower chamber 23. The two openings 24 and 36 may, of course, contain the usual decorative cloth, as represented at 37, or any desired sound passing grill work or the like.

The use of slant board 33 has the beneficial result of both inverting the phase of the pressure wave from speaker 22, and redirecting it in approximately the same direction as that of the pressure wave off the front of speaker 21. Hence, the pressure waves along both horizontal axes 26 and 37 are substantially in phase and are moving in the same general direction. There may in practice be a very slight difference in phase between the two pressure waves, because of the additional distance which the wave off speaker 22 travels, but this difference will typically have very little, if any, impact on the quality of the sound produced by the system. Although it is preferred that the two sound waves be moving in the same general direction, it is not necessary, as substantially improved performance results regardless of the general direction in which the wave from speaker 22 is moving, because it is in phase with the wave from the front of speaker 21.

Thus, the system described and shown not only includes means for relieving the varying pressure in chamber 20, by means of speaker 22 in the embodiment shown, which alone increases the efficiency of the resulting speaker system, but further includes means for inverting and directing the pressure wave from speaker 22 so that it has the same phase and general direction as the pressure wave off speaker 21. Thus, the back wave, which is wasted energy in previous systems, is handled in such a manner that it has a positive effect on the performance of the system.

The efficiency of such a speaker system is significantly greater than that of conventional speaker systems. Since from known acoustic principles, the efficiency of a speaker decreases as the cube of the resonance of the speaker, and since the use of a sealed enclosure causes a decrease in resonance of at least an octave, it can be expected that the efficiency of a given speaker system will be improved by at least a factor of 8 using applicant's system. In fact, it has been demonstrated that efficiency is frequently improved by a factor of 20 and even more, which is obviously a significant improvement. The added increase is in part due to an increase in radiating surface of the system, because the opening 36 functions as a primary radiator.

The present system is further advantageous in that it can be used as part of a relatively small audio system to upgrade its performance considerably, or it can be effectively used in a larger, more expensive system, to produce a very high level of performance, lowering system resonance and increasing output capability. The quality of sound and performance in each case is equal to or surpasses that of systems costing several times as much.

Although a preferred embodiment of the invention has been disclosed herein for purposes of illustration, it should be understood that various changes, modifications and substitutions may be incorporated in such embodiment without departing from the spirit of the invention, as defined by the claims which follow.

What is claimed is:

1. A speaker system, comprising:

a speaker housing which includes an air-impermeable first chamber and a second chamber, separated by a common wall;

a first speaker, which includes a diaphragm having a front surface and a rear surface, mounted about an opening in said first chamber and oriented such that the rear surface of the diaphragm faces the interior of said first chamber and the front surface of the diaphragm faces the atmosphere about said first chamber, so that in operation a first pressure wave produced off the front surface of the diaphragm propagates away from said first chamber in a first direction into the atmosphere, and a second pressure wave produced off the rear surface of the diaphragm propagates within said first chamber, tending to produce a varying pressure in said first chamber;

a second speaker, which also includes a diaphragm having a front surface and a rear surface, mounted about an opening in the common wall separating said first and second chambers and oriented such that the rear surface of the diaphragm faces the interior of said first chamber and the front surface of the diaphragm faces the interior of the second chamber, so that in operation, a third pressure wave produced off the front surface of the diaphragm of the second speaker propagates within said second chamber, said first and second speakers being oriented such that their respective axes of vibration are substantially perpendicular, said second speaker being driven in such a manner that the third pressure wave is a substantial replica of and is in phase with the second pressure wave, so that the pressure within said first chamber tends to remain constant; and a slant board positioned in said second chamber beneath said second speaker, wherein in operation, the third pressure wave, upon striking the slant board, undergoes a phase reversal so that it propagates through an opening in said second chamber into the atmosphere, the first and third pressure waves thus propagating away from the speaker system with substantially the same phase.

2. The apparatus of claim 1, wherein the opening in the second chamber increases in width from top to bottom.

3. An apparatus of claim 1, including means controlling the driving of said first and second speakers such that they are driven 180° out-of-phase relative to each other.

4. An apparatus of claim 2, wherein said first and second chambers are in vertical registry, wherein said first speaker is located about an opening in the front wall of said first chamber, wherein said common wall is horizontal, wherein said opening in said second chamber is in the front wall thereof and wherein said slant board is oriented such that the third pressure wave is redirected through said opening in the second chamber, so that the first and third pressure waves propagate away from the speaker system in substantially the same direction.

* * * * *